United States Patent [19]

Dickie

[11] Patent Number: 5,695,659

[45] Date of Patent: Dec. 9, 1997

[54] PROCESS FOR REMOVING A PROTECTIVE COATING FROM A SURFACE OF AN AIRFOIL

[75] Inventor: Howard B. Dickie, Hartford, Conn.

[73] Assignee: United Technologies Corporation, East Hartford, Conn.

[21] Appl. No.: 562,855

[22] Filed: Nov. 27, 1995

[51] Int. Cl.⁶ .................................. B44C 1/22; B05D 3/00
[52] U.S. Cl. .......................... 216/48; 216/102; 427/444; 244/123
[58] Field of Search ................... 216/48, 43; 427/508; 244/123

[56] References Cited

U.S. PATENT DOCUMENTS

| | | | |
|---|---|---|---|
| 3,359,129 | 12/1967 | Mao | 427/508 |
| 3,762,953 | 10/1973 | Clarke, Jr. et al. | 134/38 |
| 4,530,861 | 7/1985 | Sippel et al. | 427/444 |
| 5,216,808 | 6/1993 | Martus et al. | 29/889.1 |

Primary Examiner—R. Bruce Breneman
Assistant Examiner—Michael E. Adjodha
Attorney, Agent, or Firm—Bachman & LaPointe, P.C.

[57] ABSTRACT

The present invention relates to a process for removing a protective coating from a surface of an airfoil which process comprises the steps of providing an airfoil having a protective coating to be removed and critical areas which require protection during a coating removal step and masking these critical areas by applying an ultraviolet curable masking material to the critical areas of the airfoil. The process of the present invention further comprises the steps of curing the UV curable masking material using ultraviolet radiation and stripping the protective coating from unmasked portions of the airfoil.

23 Claims, 1 Drawing Sheet

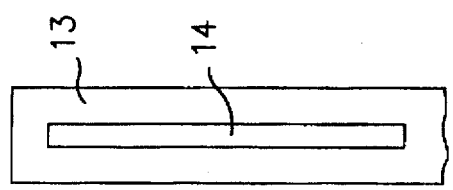
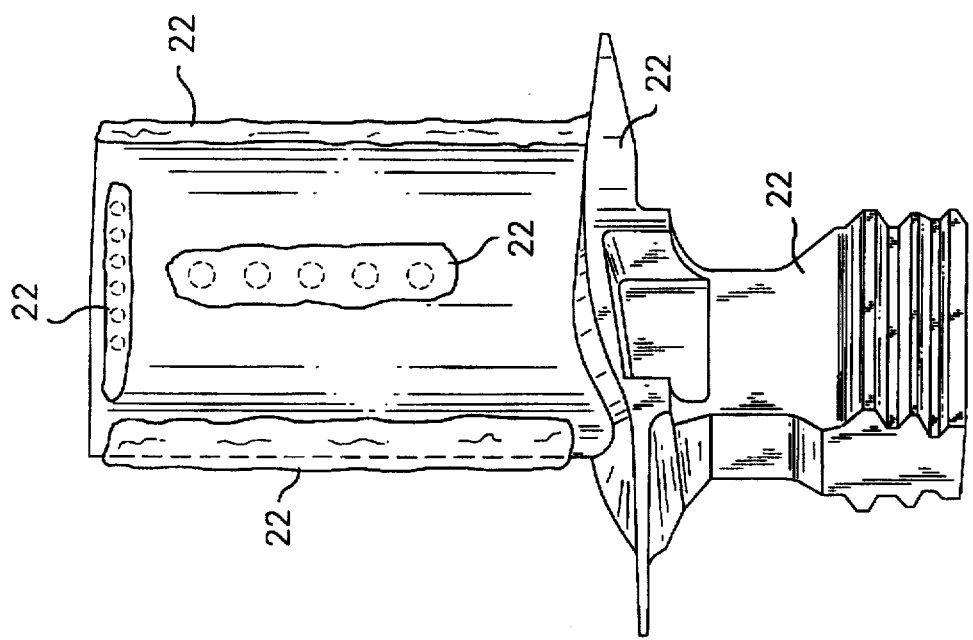
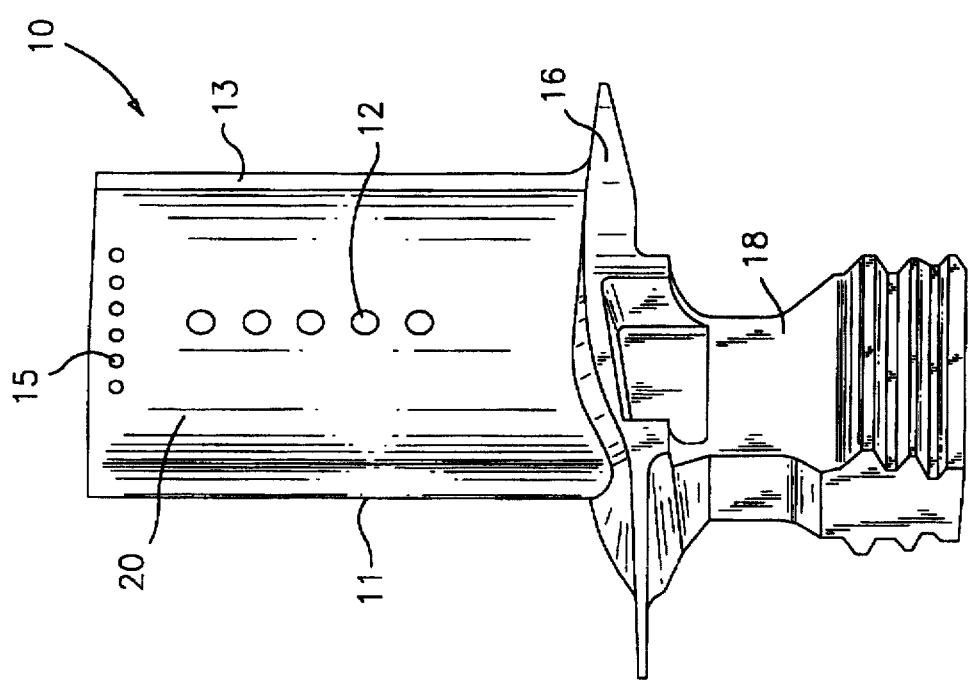

PROCESS FOR REMOVING A PROTECTIVE COATING FROM A SURFACE OF AN AIRFOIL

BACKGROUND OF THE INVENTION

The present invention relates to a process for removing a protective coating from a surface of an airfoil, which process includes using an ultraviolet curable material as a maskant material.

All turbine airfoils in need of overhauling must have any protective coatings removed or stripped so that a complete inspection for cracks can be performed. Typically, these coatings are stripped using chemicals such as hot acid solutions. There are however certain areas of the airfoil that must be masked during the chemical stripping operations so that the chemicals used during the stripping operations do not contact them and cause damage to the airfoil. These areas are said to have a critical masking requirement in that if the maskant applied to these areas leaks, the airfoil may be rendered scrap material.

In the past, waxes, lacquers and other organic coatings have been applied to these critical areas and used as a maskant material. These types of maskant materials however suffer from the deficiency that they have insufficient adhesive properties when exposed to the chemical materials used to strip the protective coating from the airfoil. As a result, the edges of these maskant materials have lifted and leaked.

To compensate for the leaking problem, the maskant materials have been applied to areas well beyond the critical areas. This extensive overmasking is undesirable since the masked coating beyond the critical areas must be mechanically removed—a time consuming and error prone process.

SUMMARY OF THE INVENTION

It is therefore an object of the present invention to provide a process for removing a protective coating from a surface of an airfoil which utilizes a maskant material which has excellent adhesive properties which substantially avoids the problem of chemical leakage.

It is a further object of the present invention to provide a process as above which utilizes a maskant material that has sufficient viscosity that it stays put where applied until cured.

It is still a further object of the present invention to provide a process as above which utilizes a maskant material which reduces the expenses and the time associated with coating removal.

It is yet a further object of the present invention to provide a process as above which utilizes a maskant material which does not require overmasking.

The foregoing objects are achieved by the process of the present invention.

In accordance with the present invention, the process for removing a protective coating from surfaces of an airfoil broadly comprises the steps of providing an airfoil having a protective coating to be removed and areas which require protection and applying a maskant material to the areas which require protection. The maskant applying step comprises applying an ultraviolet (UV) curable masking material to the areas which require protection. After the UV curable masking material has been applied, the material is cured by exposing the masking material to UV radiation for a time period sufficient to effect curing, typically about 60 seconds. After the masking material has been cured, the protective coating is stripped from non-masked portions of the airfoil using a chemical stripping technique.

Preferably, the UV curable masking material used in the process of the present invention is applied to portions of the airfoil which include turbine blade air cooling holes, a trailing edge slot, tip holes, the platform portion and/or the root portion.

Other objects and advantages associated with and other details of the process of the present invention are set forth in the following detailed description and the accompanying drawings in which like reference numerals depict like elements.

BRIEF DESCRIPTION OF THE DRAWINGS

FIG. 1 is a perspective view of a turbine blade airfoil;

FIG. 2 is a rear view of a portion of the turbine blade airfoil of FIG. 1 illustrating a trailing edge slot; and FIG. 3 is a perspective view of the turbine blade airfoil of FIG. 1 showing areas masked by a maskant material.

DETAILED DESCRIPTION OF THE PREFERRED EMBODIMENT(S)

As shown in FIGS. 1 and 2, a typical turbine blade airfoil 10 has a leading edge 11 and a trailing edge 13 and a number of critical areas which include a set of air cooling holes 12 along at least one surface, at least one slot 14 in the trailing edge, holes 15 in a tip portion of the airfoil, a platform portion 16 and a root portion 18, all of which have to be masked during the chemical stripping operation used to remove a protective coating 20 from the remaining portions of the airfoil 10. To protect these critical areas of the airfoil 10, it is desirable to cover them with a maskant material 22 as shown in FIG. 3.

It has been found by the inventor that the maskant material 22 which is applied to the airfoil to protect these critical areas must demonstrate certain properties. For example, the maskant material 22 must have sufficient adhesive properties that edges of the material do not lift and leak during the chemical stripping operation. Still further, the maskant material 22 must have a viscosity such that it stays put where applied, without sagging or running, until cured. Still further, the masking material 22 must be such that only a minimum amount of maskant material must be applied beyond the critical areas that must be protected.

In accordance with the present invention, it has been found that a particularly useful maskant material is a UV curable material. This type of material has been found to be quite advantageous in that it has the desired adhesive and viscosity properties. Still further, it has been found that advantageously the amount of time needed to cure this type of material is far less than the time needed to cure other masking materials. For example, certain masking materials previously used in removal processes required approximately four hours to cure. They also generally required the application of at least two coats. The UV curable maskant material used in the process of the present invention requires approximately 60 seconds to cure and the application of a single coat.

An UV curable material which can be used as the maskant material in the process of the present invention is an acrylic adhesive which can be activated by actinic radiation such as ultraviolet radiation. One such material is sold under the trade name DYMAX 29605. This material is a reactive acrylic adhesive activated by actinic radiation which includes, in addition to a photoinitiator, at least about 1.0 wt % of a perester compound or cumene hydroperoxide, and 0.5 wt % of a tautomeric organic acid. It is described in U.S. Pat. No. 5,039,715 to Bachmann et al. which is incorporated by reference herein.

In accordance with the present invention, the UV curable material is applied to the critical areas of the turbine blade airfoil blade containing the air cooling holes 12, the trailing edge slot(s) 14, tip holes 15, the platform portion 16, and the root portion 18. Preferably, the UV curable masking material 22 is applied by injecting the maskant material, in liquid form, through a small needle similar to a syringe so that it flows over the air cooling holes 12, the trailing edge slot(s) 14, the tip holes 15, the platform portion 16, and the root portion 18 and on areas adjacent to them. In most instances, only one coat of masking material is required to protect the critical areas. Of course, it should be recognized that in some instances two or more coats of the UV curable masking material 22 may be desirable. While it is preferred to apply the maskant material using a syringe-like needle, it should be recognized that other application techniques including painting could be used if desired.

After the UV curable masking material has been applied to the critical areas of the airfoil 10, the airfoil is subjected to ultraviolet radiation for a time period sufficient to cure the masking material. It has been found that placing the airfoil 10 with the masking material 22 under an ultraviolet lamp for a time period of approximately 60 seconds is sufficient to cure the masking material.

After the UV curable masking material has been cured, the unmasked portions of the turbine blade airfoil 10 are subjected to a chemical stripping operation to remove the protective coating. Any suitable chemical stripping operation known in the art may be used to remove the protective coating. Typically, the chemical stripping operation is an acid stripping operation using hot acid materials such as those designated by United Technologies Corporation as SPOP 301 and SPOP 308.

Thereafter, the chemicals used during the stripping operation are removed by rinsing and the UV curable maskant material 22 is removed by burning it off in a properly vented oven preferably at a temperature in the range of from about 900° F. to about 1300° F. Once the maskant material has been removed, the coating on the airfoil surfaces formerly beneath the maskant material 22 is mechanically removed by blending with fine sand paper or disks on air or electric grinders. Once the protective coating has been completely removed from the surfaces of the airfoil 10, the airfoil may be inspected for cracks, repaired, re-coated, and re-installed.

As can be seen from the foregoing discussion, the use of an UV curable material as a maskant material is quite beneficial. The UV curable material has excellent adhesive properties which allow the edges of the maskant material to adhere to the surfaces of the airfoil without leaking. Additionally, only a minimum amount of UV curable material has to be applied to the areas of the airfoil to be protected. This is quite desirable because it substantially eliminates the problem of overmasking and significantly reduces the time needed to remove the masking material. Still further, the UV curable masking material cures faster than other types of masking material. Thus, one realizes a substantial time saving by using an UV masking material in the process of the present invention.

While the process of the present invention has been described in the context of removing a protective coating from a turbine blade airfoil surface, it should be recognized that the process can be used to remove a protective coating from any type of airfoil.

It is apparent that there has been provided in accordance with this invention a process for removing a protective coating from a surface of an airfoil which fully satisfies the objects, means, and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

What is claimed is:

1. A process for removing a protective coating from surfaces of an airfoil which comprises the steps of:
providing an airfoil having a protective coating to be removed and critical spaced apart areas which require protection during a coating removal step; and
masking said critical areas by selectively applying an ultraviolet curable masking material having sufficient adhesion properties that edges of said masking material do not lift and leak during aggressive chemical operations to each of said critical areas of said airfoil.

2. The process of claim 1 wherein said airfoil has air cooling holes and said applying step comprises applying said ultraviolet curable masking material over said air cooling holes and to areas of said airfoil adjacent said air cooling holes.

3. The process of claim 1 wherein said airfoil has a trailing edge slot and said applying step comprises applying said ultraviolet curable masking material over said trailing edge slot and to areas of said airfoil adjacent said trailing edge slot.

4. The process of claim 1 wherein said airfoil has a platform portion and said applying step comprises applying said ultraviolet curable masking material over said platform portion and to areas of said airfoil adjacent said platform portion.

5. The process of claim 1 wherein said airfoil has a root portion and said applying step comprises applying said ultraviolet curable masking material over said root portion and to areas of said airfoil adjacent said root portion.

6. The process of claim 1 wherein said airfoil has a tip portion and a plurality of holes in said tip portion and said applying step comprises applying said ultraviolet curable masking material over said tip holes and to areas of said airfoil adjacent said tip holes.

7. The process of claim 1 wherein said applying step comprises applying said ultraviolet curable masking material in liquid form to said critical areas of said airfoil.

8. The process of claim 1 wherein said applying step comprises applying a reactive acrylic adhesive material activated by ultraviolet radiation.

9. The process of claim 8 wherein said applying step comprises applying a reactive acrylic adhesive which includes, in addition to a photoinitiator, at least about 1.0 wt. % of a perester compound or cumene hydroperoxide and 0.5 wt. % of a tautomeric organic acid.

10. The process of claim 1 further comprising the steps of:
curing said UV curable masking material; and
stripping said protective coating from unmasked portions of said airfoil.

11. The process of claim 10 wherein said curing step comprises exposing said UV curable masking material to ultraviolet radiation for a time sufficient to cure the masking material.

12. The process of claim 10 wherein said curing step comprises exposing said UV curable masking material to ultraviolet radiation from an ultraviolet lamp for a time period of about 60 seconds.

13. The process of claim 10 wherein said stripping operation comprises acid stripping said protective coating from said unmasked portions of said airfoil.

14. The process of claim 10 further comprising:

rinsing said airfoil after said stripping operation;

removing said cured masking material; and mechanically removing the protective coating formerly beneath said masking material.

15. The process of claim 1 wherein said airfoil has air cooling holes, a trailing edge slot, a platform portion, a root portion, a tip portion and a plurality of holes in said tip portion and said applying step comprises selectively applying said ultraviolet curable masking material over said air cooling holes and to areas of said airfoil adjacent said air cooling holes, over said trailing edge slot and to areas of said airfoil adjacent said trailing edge slot, over said platform portion and to areas of said airfoil adjacent said platform portion, over said root portion and to areas of said airfoil adjacent said root portion and over said tip holes and to areas of said airfoil adjacent said tip holes.

16. A process for removing a protective coating from surfaces of an airfoil which comprises the steps of:

providing an airfoil having a protective coating to be removed and critical areas which require protection during a coating removal step;

applying an ultraviolet curable masking material having sufficient adhesion properties that edges of said masking material do not lift and leak during aggressive chemical operations in liquid form to said critical areas of said airfoil;

curing said masking material by applying ultraviolet radiation to said masking material for a time sufficient to cure said masking material; and removing said protective coating from unmasked portions of said airfoil surfaces by applying at least one hot acid solution to said unmasked portions and without causing said edges of said masking material to lift and leak.

17. An airfoil which has a protective coating on its surfaces to be removed by contact with a chemical solution and which has an ultraviolet curable masking material over selected portions of said surfaces, said ultraviolet curable masking material being adhesively bonded to said airfoil at said selected portions such that edges of said masking material do not lift during said contact between said airfoil and said chemical solution thereby preventing said chemical solution from leaking between said masking material and said selected portions covered by said masking material.

18. The airfoil of claim 17 wherein said masking material is in a cured state.

19. The airfoil of claim 17 wherein said airfoil has air cooling holes and said masking material covers said air cooling holes and areas of said airfoil adjacent said air cooling holes.

20. The airfoil of claim 17 wherein said airfoil has at least one trailing edge slot and said masking material covers said at least one trailing edge slot and areas of said airfoil adjacent said at least one trailing edge slot.

21. The airfoil of claim 17 wherein said airfoil has a platform portion and said masking material covers said platform portion and areas of said airfoil adjacent said platform portion.

22. The airfoil of claim 17 wherein said airfoil has a root portion and said masking material covers said root portion and areas of said airfoil adjacent said root portion.

23. The airfoil of claim 17 wherein said airfoil has a plurality of holes adjacent a tip portion and said masking material covers said holes and areas of said airfoil adjacent said holes.

* * * * *